United States Patent
Suehiro et al.

(10) Patent No.: US 7,189,591 B2
(45) Date of Patent: *Mar. 13, 2007

(54) PROCESS FOR PRODUCING LIGHT-EMITTING SEMICONDUCTOR DEVICE

(75) Inventors: Ichirou Suehiro, Osaka (JP); Yuji Hotta, Osaka (JP); Naoki Sadayori, Osaka (JP); Noriaki Harada, Osaka (JP)

(73) Assignee: Nitto Denko Corporation, Osaka (JP)

( * ) Notice: Subject to any disclaimer, the term of this patent is extended or adjusted under 35 U.S.C. 154(b) by 24 days.

This patent is subject to a terminal disclaimer.

(21) Appl. No.: 11/013,409

(22) Filed: Dec. 17, 2004

(65) Prior Publication Data

US 2005/0148105 A1   Jul. 7, 2005

(30) Foreign Application Priority Data

Dec. 19, 2003  (JP)  .......................... P.2003-423131

(51) Int. Cl.
    *H01L 21/02*  (2006.01)
(52) U.S. Cl. ................. 438/29; 257/E21.002
(58) Field of Classification Search .................. 257/98; 525/907; 438/29–32; 359/620
    See application file for complete search history.

(56) References Cited

U.S. PATENT DOCUMENTS

| 4,225,698 | A  | * | 9/1980  | Medem et al. ............. 528/176 |
| 5,225,935 | A  | * | 7/1993  | Watanabe et al. ........... 359/619 |
| 6,437,918 | B1 | * | 8/2002  | Hamanaka et al. ......... 359/620 |
| 6,495,862 | B1 | * | 12/2002 | Okazaki et al. ............. 257/103 |
| 6,657,236 | B1 | * | 12/2003 | Thibeault et al. ............. 257/98 |
| 6,669,869 | B2 | * | 12/2003 | Yamaguchi et al. ......... 252/512 |
| 6,831,302 | B2 | * | 12/2004 | Erchak et al. ................ 257/87 |
| 6,961,185 | B2 | * | 11/2005 | Suehiro et al. ............. 359/620 |
| 6,987,613 | B2 | * | 1/2006  | Pocius et al. ............... 359/565 |
| 2003/0125503 | A1 | * | 7/2003 | Sakamoto et al. .......... 528/125 |
| 2004/0167310 | A1 |  | 8/2004  | Suehiro et al. |

FOREIGN PATENT DOCUMENTS

| JP | 10-65220    A | 3/1998 |
| JP | 2000-196152 A | 7/2000 |
| JP | 2003-174191 A | 6/2003 |

* cited by examiner

*Primary Examiner*—B. William Baumeister
*Assistant Examiner*—Matthew W. Such
(74) *Attorney, Agent, or Firm*—Sughrue Mion, PLLC

(57) ABSTRACT

The invention provides a process for producing a light-emitting semiconductor device, which comprises: (1) forming a polycarbodiimide-containing layer on a light takeout side of a light-emitting semiconductor element; and (2) forming irregularities on the surface of the polycarbodiimide-containing layer.

7 Claims, 1 Drawing Sheet

PROCESS FOR PRODUCING LIGHT-EMITTING SEMICONDUCTOR DEVICE

FIELD OF THE INVENTION

The present invention relates to a process for producing a light-emitting semiconductor device.

BACKGROUND OF THE INVENTION

There has been reported a technique in which irregularities are formed on the light takeout surface of a light-emitting semiconductor element in order to heighten the efficiency in light takeout of the light-emitting semiconductor element (see, for example, patent document 1).

However, the processing of a semiconductor surface for forming irregularities thereon necessitates etching by the RIE (reactive ion etching) or ion milling method and this step takes troubles and costs.

Hence, there has been proposed a technique in which an antireflection film comprising a polyimide resin and $TiO_2$ added thereto is formed on the light takeout surface of a light-emitting semiconductor element and irregularities are formed on the surface of the film with a die press to thereby improve the efficiency in light takeout (see, for example, patent document 2).

Patent Document 1: JP 2000-196152 A
Patent Document 2: JP 2003-174191 A

However, since the film comprises a polyimide, the formation of irregularities on the surface of the film with a die press usually necessitates application of a pressure higher than 1 MPa to the light-emitting semiconductor element at 300° C. or higher. There is a possibility that such a high temperature and high pressure might damage the light-emitting semiconductor element.

SUMMARY OF THE INVENTION

Accordingly, an object of the invention is to provide a process for light-emitting semiconductor device production which yields a light-emitting semiconductor device providing a satisfactory efficiency of light takeout from a light-emitting semiconductor element and which can prevent the light-emitting semiconductor element from being damaged in the production thereof.

Other objects and effects of the invention will become apparent from the following description.

Namely, the invention relates to:

1. A process for producing a light-emitting semiconductor device which comprises:

(1) forming a polycarbodiimide-containing layer on a light takeout side of a light-emitting semiconductor element; and (2) forming irregularities on the surface of the polycarbodiimide-containing layer.

2. The process for producing a light-emitting semiconductor device of item 1 above, wherein the polycarbodiimide-containing layer contains a polycarbodiimide represented by general formula (1):

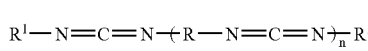

(1)

wherein R represents a diisocyanate residue, R1 represents a monoisocyanate reside, and n is an integer of 1 to 100.

3. The process for producing a light-emitting semiconductor device of item 1 or 2 above, wherein the polycarbodiimide-containing layer before the formation of irregularities has a thickness of 0.5 to 10 μm.

According to the inventions the light-emitting semiconductor element can be prevented from being damaged during production and a light-emitting semiconductor device having a satisfactory efficiency of light takeout can be produced.

Figure 1:
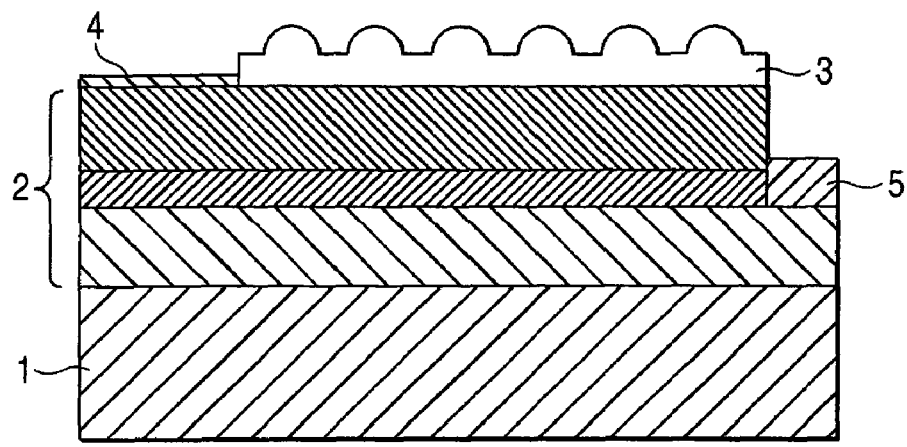
FIG. 1 is a sectional view of one embodiment of the light-emitting semiconductor device to be produced by the process of the invention.

The reference numerals used in the drawings denote the followings, respectively.

1: substrate
2: semiconductor layer
3: polycarbodiimide layer
4: electrode
5: electrode
6: die
7: heated pressing plate

DETAILED DESCRIPTION OF THE INVENTION

The process of the invention for producing a light-emitting semiconductor device comprises:

(1) forming a polycarbodiimide-containing layer (hereinafter sometimes referred to as a "polycarbodiimide layer") on a light takeout side of a light-emitting semiconductor element; and (2) forming irregularities on the surface of the polycarbodiimide-containing layer.

An example of the light-emitting semiconductor device to be produced by the process of the invention is shown in FIG. 1. This device has a light-emitting semiconductor element comprising a substrate 1, a semiconductor layer 2 comprising one or more layers superposed on one side of the substrate 1, and an electrode 4 formed on the semiconductor layer 2. A polycarbodiimide layer 3 processed so as to have irregularities has been formed on the semiconductor layer 2 of the light-emitting semiconductor element. Furthermore, a part of the polycarbodiimide layer 3 and semiconductor layer 2 has been selectively removed by etching, and an electrode 5 has been formed on that portion. The light emitted by the light-emitting semiconductor element is observed on the side opposite to the substrate 1, i.e., on the side on which the semiconductor layer 2 and the polycarbodiimide layer 3 have been superposed (this side is hereinafter sometimes referred to as the "light takeout side").

The superposition of a polycarbodiimide layer (refractive index=about 1.7 to 1.8) on the semiconductor layer has an effect of reducing the difference in refractive index between the semiconductor layer (refractive index=about 2.5 to 3.5) and the surrounding atmosphere (e.g., air (refractive index=about 1), an epoxy resin (refractive index=about 1.54), or the like). As a result, the critical angle between the layers widens and light takeout from the light-emitting semiconductor element becomes easy. Furthermore, the processing for imparting irregularities to the surface of the polycarbodiimide layer produces an effect that the amount of light incident at an angle within the critical angle between the two layers is increased by the irregularities to thereby improve the efficiency of light takeout. In addition, the use of a polycarbodiimide layer is effective in preventing the light-emitting semiconductor element from being damaged during production thereof.

Examples of the substrate to be used in the invention include sapphire substrates, silicon carbide substrates, silicon substrates, and the like. Sapphire substrates are preferred from the standpoints of securing transparency and refractive index and of stable supply to the market. The thickness of the substrate is preferably 50 to 500 μm, more preferably 50 to 80 μm.

Examples of the semiconductor layer to be used in the invention include semiconductor layers in ordinary use in this field, such as GaN layers, GaP layers, GaS layers, GaAs layers, and the like. A suitable one is selected according to the light emitted. For forming the semiconductor layer, a known method may be used. For example, the layer is formed on the substrate by the MOVCD method. The thickness of the whole semiconductor layer including all of a buffer layer, p-layer, light-emitting layer, n-layer, etc. is preferably 1 to 5 μm.

Examples of the materials of the electrodes to be used in the invention include gold, silver, nickel, chromium, copper, and the like. Gold is preferred from the standpoints of suitability for bonding in a step after mounting and of securing surface stability.

The electrode may be formed on the semiconductor layer by a known method, e.g., vapor deposition or the like, either before the formation of a polycarbodiimide layer or after the formation of a polycarbodiimide layer. In the former case, although the polycarbodiimide superposed overlies the electrode, there may be made use of a method in which a resist mask is formed on the polycarbodiimide layer after formation of the polycarbodiimide layer and the part of the polycarbodiimide which overlies the electrode is removed by RIE or the like to expose the electrode. In the latter case, there may be made use of a method which comprises forming a resist mask on the polycarbodiimide layer, removing the electrode formation part of the polycarbodiimide layer by RIE or the like, and then forming an electrode on the electrode formation part by vapor deposition or the like.

Examples of the polycarbodiimide to be used in the invention include various polycarbodiimides. However, a polycarbodiimide represented by formula (1):

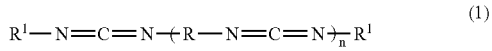

$$R^1-N=C=N-(R-N=C=N)_n-R^1 \quad (1)$$

(wherein R represents a diisocyanate residue, $R^1$ represents a monoisocyanate residue, and n is an integer of 1 to 100) is preferred because a high refractive index is obtained therewith.

In the invention, the polycarbodiimide represented by formula (1) is obtained by subjecting one or more diisocyanates to a condensation reaction and blocking the terminals of the polymer with a monoisocyanate.

In formula (1), R represents a residue of the diisocyanate used as a starting material and $R^1$ represents a residue of the monoisocyanate used as another starting material. Symbol n is an integer of 1 to 100.

The diisocyanate and monoisocyanate to be used as starting materials may be either aromatic or aliphatic. The diisocyanate and the monoisocyanate each may comprises one or more aromatic isocyanates alone or one or more aliphatic isocyanates alone, or may comprise a combination thereof. From the standpoint of obtaining a polycarbodiimide having a higher refractive index, it is preferred to use aromatic isocyanates in the invention. Namely, it is preferred that at least either of the diisocyanate and the monoisocyanate comprise an aromatic isocyanate or consist of one or more aromatic isocyanates, or that each of the diisocyanate and the monoisocyanate consist of one or more aromatic isocyanates. More preferred is the case in which the diisocyanate comprises a combination of an aliphatic isocyanate and an aromatic isocyanate and the monoisocyanate consists of one or more aromatic isocyanates. Especially preferred is the case in which the diisocyanate and the monoisocyanate each consist of one or more aromatic isocyanates.

Examples of diisocyanates usable in the invention include hexamethylene diisocyanate, dodecamethylene diisocyanate, 2,2,4-trimethylhexamethylene diisocyanate, 4,4'-dichlorohexylmethane diisocyanate, xylylene diisocyanate, tetramethylxylylene diisocyanate, isophorone diisocyanate, cyclohexyl diisocyanate, lysine diisocyanate, methylcyclohexane 2,4'-diisocyanate, 4,4'-diphenylmethane diisocyanate, 4,4'-diphenyl ether diisocyanate, 2,6-tolylene diisocyanate, 2,4-tolylene diisocyanate, naphthalene diisocyanate, 1-methoxyphenyl 2,4-diisocyanate, 3,3'-dimethoxy-4,4'-diphenylmethane diisocyanate, 4,4'-diphenyl ether diisocyanate, 3,3$^1$-dimethyl-4,4'-diphenyl ether diisocyanate, 2,2-bis[4-(4-isocyanatophenoxy)phenyl]-hexafluoropropane, 2,2-bis[4-(4-isocyanatophenoxy)phenyl]-propane, and the like.

From the standpoint of attaining a high refractive index, it is preferred to use, among those diisocyanates, at least one member selected from the group consisting of tolylene diisocyanate, 4,4'-diphenylmethane diisocyanate, naphthalene diisocyanate, hexamethylene diisocyanate, and dodecamethylene diisocyanate. More preferred is naphthalene diisocyanate.

Those diisocyanates can be used singly or as a mixture of two or more thereof. From the standpoint of heat resistance, however, it is preferred to use a mixture of two or three diisocyanates.

The one or more diisocyanates to be used as a starting material preferably comprise one or more aromatic diisocyanates in an amount of preferably 10% by mole or larger (the upper limit being 100% by mole) based on all diisocyanates used. These diisocyanates desirably are ones enumerated above as preferred examples.

Examples of monoisocyanates usable in the invention include cyclohexyl isocyanate, phenyl isocyanate, p-nitrophenyl isocyanate, p- and m-tolyl isocyanates, p-formylphenyl isocyanate, p-isopropylphenyl isocyanate, 1-naphthyl isocyanate, and the like.

Preferred monoisocyanates are aromatic monoisocyanates because aromatic monoisocyanates do not react with each other and the terminal blocking of a polycarbodiimide with such monoisocyanates proceeds efficiently. It is more preferred to use 1-naphthyl isocyanate.

Those monoisocyanates can be used singly or as a mixture of two or more thereof.

The amount of the monoisocyanate to be used for terminal blocking is preferably in the range of 1 to 10 mol per 100 mol of the diisocyanate ingredient to be used, from the standpoint of storage stability.

The production of the polycarbodiimide to be used in the invention can be conducted by converting one or more diisocyanates as a starting material to a carbodiimide through condensation reaction in a predetermined solvent in the presence of a catalyst for carbodiimide formation and blocking the terminals of the resultant carbodiimide polymer with a monoisocyanate.

The diisocyanate condensation reaction is conducted at a temperature of generally 0 to 150° C., preferably 10 to 120° C.

In the case where an aliphatic diisocyanate and an aromatic diisocyanate are used in combination as starting-material diisocyanates, it is preferred to react the diisocyanates at a low temperature. The reaction temperature is preferably 0 to 50° C., more preferably 10 to 40° C. Use of a reaction temperature in this range is preferred because the condensation of the aliphatic diisocyanate with the aromatic diisocyanate proceeds sufficiently.

In the case where an excess aromatic diisocyanate present in the reaction solution is desired to be further reacted with the polycarbodiimide formed from an aliphatic diisocyanate and an aromatic diisocyanate, the reaction temperature is preferably 40 to 150° C., more preferably 50 to 120° C. As long as the reaction temperature is within this range, any desired solvent can be used to smoothly conduct the reaction. That reaction temperature range is therefore preferred.

The diisocyanate concentration in the reaction solution is preferably 5 to 80% by weight. As long as the diisocyanate concentration is within this range, carbodiimide formation proceeds sufficiently and reaction control is easy. That diisocyanate concentration range is therefore preferred.

Terminal blocking with a monoisocyanate can be accomplished by adding the monoisocyanate to the reaction solution in an initial, middle, or final stage of carbodiimide formation from the diisocyanate(s) or throughout the carbodiimide formation. This monoisocyanate is preferably an aromatic monoisocyanate.

As the catalyst for carbodiimide formation can be advantageously used any of known phosphorus compound catalysts. Examples thereof include phospholene oxides such as 1-phenyl-2-phospholene 1-oxide, 3-methyl-2-phospholene 1-oxide, 1-ethyl-2-phospholene 1-oxide, 3-methyl-1-phenyl-2-phospholene 2-oxide, and the 3-phospholene isomers of these.

The solvent (organic solvent) to be used for producing the polycarbodiimide is a known one. Examples thereof include halogenated hydrocarbons such as tetrachloroethylene, 1,2-dichloroethane, and chloroform, ketone solvents such as acetone, methyl ethyl ketone, methyl isobutyl ketone, and cyclohexanone, cyclic ether solvents such as tetrahydrofuran and dioxane, and aromatic hydrocarbon solvents such as toluene and xylene. These solvents can be used singly or as a mixture of two or more thereof. These solvents are used also for dissolving the polycarbodiimide obtained.

The end point of the reaction can be ascertained by infrared spectroscopy (IR analysis) from the occurrence of absorption attributable to the carbodiimide structure (N=C=N) (2,140 cm$^{-1}$) and the disappearance of absorption attributable to the isocyanates (2,280 cm$^{-1}$).

After completion of the carbodiimide-forming reaction, a polycarbodiimide is obtained usually in the form of a solution. However, the solution obtained may be poured into a poor solvent such as methanol, ethanol, isopropyl alcohol, or hexane to precipitate the polycarbodiimide and remove the unreacted monomers and the catalyst.

In preparing a solution of the polycarbodiimide which has been recovered as a precipitate, the precipitate is washed and dried in a predetermined manner and then dissolved again in an organic solvent. By performing this operation, the polycarbodiimide solution can have improved storage stability.

In the case where the polycarbodiimide solution contains by-products, the solution may be purified, for example, by adsorptively removing the by-products with an appropriate adsorbent. Examples of the adsorbent include alumina gel, silica gel, activated carbon, zeolites, activated magnesium oxide, activated bauxite, Fuller's earth, activated clay, molecular sieve carbon, and the like. These adsorbents can be used singly or in combination of two or more thereof.

By the method described above, the polycarbodiimide to be used in the invention is obtained. From the standpoint of further heightening the efficiency of light takeout, the polycarbodiimide is preferably one in which the backbone structure is constituted of aromatic and aliphatic diisocyanates and the terminals have been blocked with an aromatic monoisocyanate. More preferred is one in which the backbone structure is constituted of one or more aromatic diisocyanates and the terminals have been blocked with an aromatic monoisocyanate.

Specifically, the polycarbodiimide is preferably one in which 10% by mole or more (the upper limit being 100% by mole) of the diisocyanate residues represented by R in formula (1) are residues of one or more aromatic diisocyanates and the monoisocyanate residues represented by $R^1$ in formula (1) are residues of one or more aromatic monoisocyanates. The diisocyanate residues are preferably at least one member selected from the group consisting of tolylene diisocyanate residues, 4,4'-diphenylmethane diisocyanate residues, naphthalene diisocyanate residues, hexamethylene diisocyanate residues, and dodecamethylene diisocyanate residues, and more preferably are naphthalene diisocyanate residues. The aromatic monoisocyanate residues are preferably 1-naphthyl isocyanate residues.

Fine particles of a metal oxide such as titanium oxide or zirconium oxide may be further added to the polycarbodiimide layer for the purpose of heightening refractive index. The average particle diameter of such fine metal oxide particles is preferably 2 to 100 nm from the standpoint of securing transparency. The content of the fine metal oxide particles in the polycarbodiimide layer is preferably 20 to 50% by volume, more preferably 22 to 30% by volume, based on the solid content of the polycarbodiimide. By thus adding fine metal oxide particles to the polycarbodiimide layer, the refractive index of the polycarbodiimide layer can be regulated to about 1.8 to 2.1.

The polycarbodiimide layer can be formed, for example, in the following manner. A polycarbodiimide represented by general formula (1) is dissolved in a solvent such as cyclohexanone or toluene, and fine metal oxide particles are optionally added thereto and dispersed in the solution. This solution is applied on the surface of the semiconductor layer by a known technique, e.g., casting, spin coating, or the like, and dried to form the polycarbodiimide layer. The application on the surface of the semiconductor layer may be conducted before cutting into individual devices as in the manner described above or after cutting into individual devices.

It is preferred that the polycarbodiimide solution applied on the surface of the semiconductor layer be dried under such temperature and time conditions that the solvent can be removed, for the purpose of drying the solution without causing the curing reaction of the polycarbodiimide to proceed excessively. Specifically, the drying temperature is preferably 20 to 200° C., more preferably 50 to 150° C. The time period is preferably 5 to 60 minutes, more preferably 10 to 20 minutes.

The thickness of the polycarbodiimide layer obtained in the manner described above is preferably 0.5 to 10 μm, from the standpoints of preventing light attenuation during light transmission and securing processability in forming irregularities. The refractive index thereof is preferably 1.7 or higher, more preferably 1.85 or higher, from the standpoint of heightening the efficiency of light takeout. Furthermore, the modulus of elasticity thereof at 150° C. is preferably 0.2 to 3 GPa, more preferably 0.2 to 1 GPa, from the standpoint of securing processability in forming irregularities.

The formation of irregularities on the surface of the polycarbodiimide layer formed in the manner described above can be conducted, for example, by heating/pressing the surface of the polycarbodiimide layer with a die having predetermined surface irregularities. In the invention, use can be made, for example, of a die produced by forming predetermined surface irregularities on, e.g., a polyimide sheet or polycarbonate sheet by laser processing and depositing a metal such as nickel on this sheet as a master by electroforming.

Figure 2:
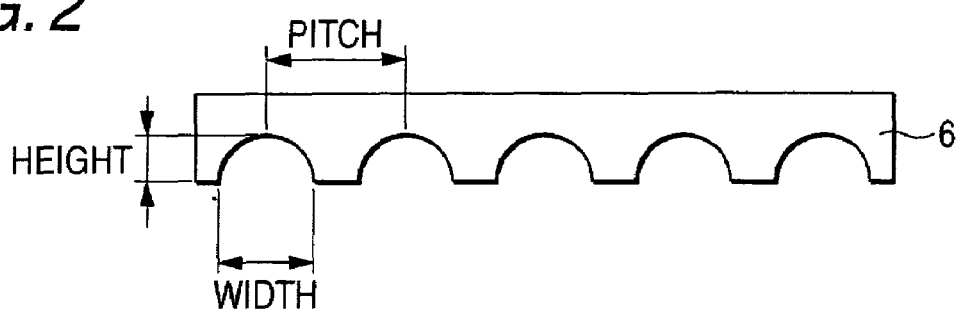
FIG. 2 is a sectional view of one embodiment of a die for use in the process of the invention.
Figure 3:
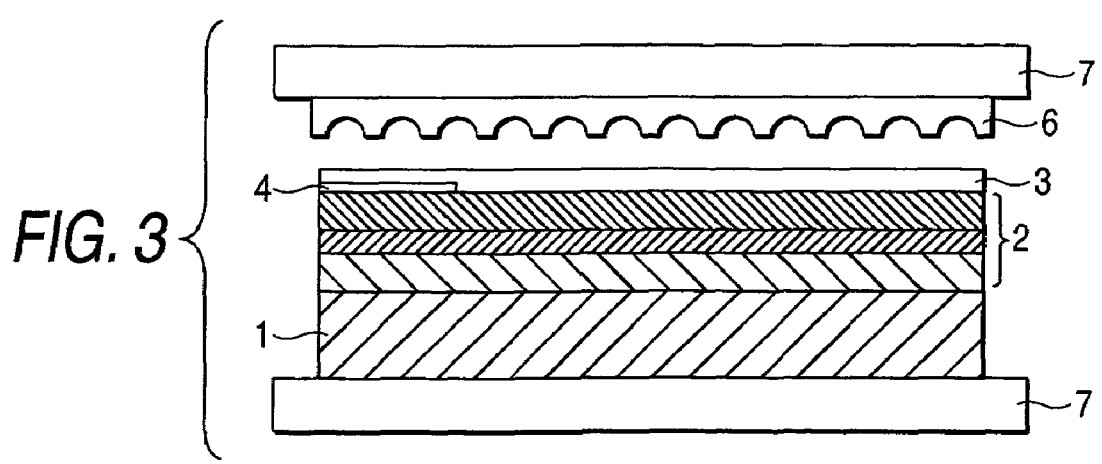
FIG. 3 is a view illustrating the step of forming irregularities in the process of the invention.

The formation of surface irregularities using the die can be conducted, for example, in the following manner. Alignment of a die 6 shown in FIG. 2 is conducted so as to form a polycarbodiimide layer having surface irregularities. Furthermore, the light-emitting semiconductor element is inserted into the space between a heated pressing plate 7 and the other heated pressing plate 7 as shown in FIG. 3 and heated/pressed, whereby irregularities can be formed on the surface of the polycarbodiimide layer superposed in step (1).

Examples of conditions for the heating/pressing include heating at preferably 70 to 200° C., more preferably 100 to 180° C., pressing at preferably 0.1 to 10 MPa, more preferably 0.1 to 3 MPa, and a period of the heating/pressing of preferably from 5 seconds to 3 minutes, more preferably from 10 seconds to 1 minute.

The shape of the irregularities formed on the surface of the polycarbodiimide layer is not particularly limited as long as the irregularities have been designed to improve the efficiency of light takeout. However, from the standpoint of securing the accuracy of processing of the die for obtaining surface irregularities, the shape of the surface irregularities is preferably semispherical, conical, pyramidal, or the like. From the standpoint of optimizing the efficiency of light takeout, the distance between the top and the bottom (i.e., height) in each irregularity is preferably 1 to 5 μm, the width of each protrusion is preferably 1 to 5 μm, and the pitch of the tops is preferably 1.0 to 2.0 times, more preferably 1.5 times, the width of each protrusion.

It is preferred that after the formation of irregularities on the surface of the polycarbodiimide layer, this layer be further heated at a temperature of about 120 to 200° C. for about 1 to 5 hours in order to completely cure the polycarbodiimide in the layer.

The light-emitting semiconductor device thus obtained is cut into individual devices with, e.g., a dicer or the like.

By producing a light-emitting semiconductor device in the manner described above, the light-emitting semiconductor element can be prevented from being damaged during the formation of surface irregularities and the light-emitting semiconductor device obtained can have a satisfactory efficiency of light takeout.

Embodiments of the process of the invention include a process in which a polycarbodiimide layer is formed on a semiconductor layer and irregularities are then formed on the surface of the polycarbodiimide layer, as described above. However, the light-emitting semiconductor device may be produced by a process in which a polycarbodiimide layer having irregularities formed thereon beforehand is superposed on a semiconductor layer of a light-emitting semiconductor element.

The light-emitting semiconductor device produced by the process of the invention is used in the production of a light-emitting diode (LED) by a known method. For example, in the case of producing a bullet-shaped LED, the light-emitting semiconductor device is bonded with a silver paste or the like to that flat part in a cup which functions as a reflector. Wire bonding is then conducted using gold wires to connect the electrode terminals to a lead frame. Thereafter, a resin embedding procedure with an epoxy resin heretofore in use is conducted by transfer molding or the like to thereby produce a bullet-shaped LED.

EXAMPLES

The present invention will be illustrated in greater detail with reference to the following Examples, but the invention should not be construed as being limited thereto.

In the following Examples, all synthesis reactions were conducted in a nitrogen stream. IR analysis was made with FT/IR-230 (manufactured by Nippon Bunko K.K.).

Production Example 1

Production of Polycarbodiimide:

Into a 500-mL four-necked flask equipped with a stirrer, dropping funnel, reflux condenser, and thermometer were introduced 29.89 g (171.6 mmol) of tolylene diisocyanate (isomer mixture; T-80, manufactured by Mitsui-Takeda Chemical), 94.48 g (377.52 mmol) of 4,4'-diphenylmethane diisocyanate, 64.92 g (308.88 mmol) of naphthalene diisocyanate, and 184.59 g of toluene. These ingredients were mixed together.

Thereto were added 8.71 g (51.48 mmol) of 1-naphthyl isocyanate and 0.82 g (4.29 mmol) of 3-methyl-1-phenyl-2-phospholene 2-oxide. The resultant mixture was heated to 100° C. with stirring and held for 2 hours.

The end point of the reactions was ascertained by IR analysis and the reaction mixture was cooled to room temperature. Thus, a polycarbodiimide solution was obtained. In this polycarbodiimide, 100% by mole of the diisocyanate residues were aromatic diisocyanate residues. This polycarbodiimide was represented by formula (1) described above wherein n ranged from 15 to 77.

The polycarbodiimide solution obtained was diluted with cyclohexanone to a solid content of 20% by weight to prepare a solution. Thereto was added titanium oxide (average particle diameter, 100 nm; manufactured by Dainippon Ink & Chemicals, Inc.) in an amount of 33% by volume based on the solid content of the polycarbodiimide. The titanium oxide was dispersed in the solution to obtain a polycarbodiimide coating fluid. The viscosity thereof was measured with a viscometer (EC-100S, manufactured by Tokimec Inc.) and was found to be 75 mPa.s.

The coating fluid obtained was applied to a glass substrate by spin coating and dried at 150° C. for 1 hour to form a polycarbodiimide layer having a thickness of 2 μm. The refractive index of the layer was measured with a spectrophotometer (V-3000, manufactured by Hitachi Ltd.) at a wavelength of 550 nm and a temperature of 25° C. and was found to be 2.05. The modulus of elasticity thereof was measured with a viscoelastometer (DMS120, manufactured by Seiko Instrument Inc.) and was found to be 0.3 GPa.

Production Example 2

Production of Polycarbodiimide Sheet:

The polycarbodiimide solution obtained in Production Example 1 was applied to a separator (thickness, 50 μm) (manufactured by Toray Industries, Inc.) made of poly (ethylene terephthalate) treated with a release agent (fluorinated silicone). The solution applied was heated at 130° C. for 1 minute and then heated at 150° C. for 1 minute. The separator was removed to obtain a temporarily cured sheet-form polycarbodiimide (thickness, 20 μm).

Example 1

Production of Light-Emitting Semiconductor Devices:

An element (diameter, 100 mm; thickness, 100 μm) was prepared which had been obtained by forming a GaN layer on a sapphire substrate and forming an electrode (gold electrode) on the GaN layer.

The coating fluid produced in Production Example 1 was applied on the surface of the element by spin coating (5,000 rpm; 60 seconds) and dried at 120° C. for 30 minutes with a non-circulating drying oven to form a polycarbodiimide layer having a thickness of 2 μm.

Subsequently, a die made of nickel (110 mm×110 mm) was prepared which had semispherical recesses each having a width of 4 μm and a height of 2 μm at a pitch of 6 μm as shown in FIG. 2.

The die 6 and the light-emitting semiconductor element having thereon the polycarbodiimide layer were set between the heated pressing plates 7 of a pressing type vacuum laminator (V130, manufactured by Nichigo-Morton Co., Ltd.) as shown in FIG. 3. The element having the polycarbodiimide layer was heated/pressed at 150° C. and 0.3 MPa for 1 minute to form irregularities on the surface of the polycarbodiimide layer 3.

Subsequently, a resist mask was formed on the polycarbodiimide layer, and that part of the polycarbodiimide layer which overlay the electrode was removed by RIE to expose the electrode 4.

Thereafter, the light-emitting semiconductor element having the polycarbodiimide layer was further heated at 175° C. for 5 hours in order to completely cure the polycarbodiimide of the polycarbodiimide layer to obtain a light-emitting semiconductor device. This light-emitting semiconductor device was then cut into a 0.4 mm×0.4 mm size with a dicer to obtain individual light-emitting semiconductor devices.

Example 2

Production of Light-Emitting Semiconductor Devices:

An element (diameter, 100 mm; thickness, 100 μm) was prepared which had been obtained by forming a GaN layer on a sapphire substrate and forming an electrode (gold electrode) on the GaN layer.

The polycarbodiimide sheet produced in Production Example 2 was disposed on that side of the light-emitting semiconductor element on which the GaN layer and the electrode had been formed. Subsequently, the die made of nickel (110 mm×110 mm) used in Example 1, which had semispherical recesses each having a width of 4 μm and a height of 2 μm at a pitch of 6 μm as shown in FIG. 2, was superposed thereon. This assemblage was heated/pressed at 150° C. and 0.3 MPa for 1 minute with a pressing type vacuum laminator (V130, manufactured by Nichigo-Morton Co., Ltd.) to thereby bond the polycarbodiimide sheet to the light-emitting semiconductor element and form irregularities on the surface of the polycarbodiimide sheet.

Subsequently, a resist mask was formed on the polycarbodiimide layer, and that part of the polycarbodiimide layer which overlay the electrode was removed by RIE to expose the electrode 4.

Thereafter, the light-emitting semiconductor element having the polycarbodiimide layer was further heated at 175° C. for 5 hours in order to completely cure the polycarbodiimide of the polycarbodiimide layer to obtain a light-emitting semiconductor device. This light-emitting semiconductor device was then cut into a 0.4 mm×0.4 mm size with a dicer to obtain individual light-emitting semiconductor devices.

Comparative Example 1

Using the polycarbodiimide coating fluid produced in Production Example 1, light-emitting semiconductor devices were produced in the same manner as in Example 1, except that irregularities were not formed on the surface of the polycarbodiimide layer.

Comparative Example 2

A polyimide solution (JP-200, manufactured by Nitto Denko Corp.) was applied to a glass substrate by spin coating and dried at 150° C. for 1 hour to form a polyimide layer having a thickness of 2 μm. The refractive index of the layer was measured with a spectrophotometer (V-3000, manufactured by Hitachi Ltd.) at a wavelength of 550 nm and a temperature of 25° C. and was found to be 1.68. The modulus of elasticity thereof was measured with a viscoelastometer (DMS120, manufactured by Seiko Instrument Inc.) and was found to be 23 GPa.

It was attempted to produce semiconductor devices using the polyimide solution under the same pressure/temperature conditions as in Example 1. However, irregularities could not be formed on the surface of the polyimide layer. It was hence impossible to produce semiconductor devices in which the polyimide layer had been processed so as to have surface irregularities.

Test Example

The light-emitting semiconductor devices obtained in Example 1, Example 2, and Comparative Example 1 and the light-emitting semiconductor device obtained in Comparative Example 2 which had not undergone the processing for imparting surface irregularities were mounted in a lead frame having a cup, by fixing each device to the cup part with a silver paste containing a thermoplastic resin as the base through thermal drying. Thereafter, the electrode parts of each light-emitting semiconductor device were connected to the lead frame by gold wires by means of a wire bonder. Thereafter, a cup for bullet-shaped LED encapsulation was used to encapsulate each device into a bullet shape with an epoxy resin to obtain a bullet-shaped LED. A voltage was applied to each bullet-shaped LED obtained, and the quantity of light emitted by the LED was measured. In the measurement of the quantity of light emitted, the quantity of overall light emitted was measured with MCPD-3000 (manufactured by Otsuka Electronics Co., Ltd.) using an integrating sphere. The results are shown in Table 1.

TABLE 1

| | Quantity of light emitted ($\mu W/cm^2/nm$) |
|---|---|
| Example 1 | 0.35 |
| Example 2 | 0.36 |
| Comparative Example 1 | 0.20 |
| Comparative Example 2 | 0.16 |

The results given above show that the LEDs produced from the light-emitting semiconductor devices obtained by forming a polycarbodiimide layer on a semiconductor layer and forming irregularities on the surface of the polycarbodiimide layer emitted a larger quantity of light than the LED produced from the light-emitting semiconductor device of Comparative Examples. It can hence be seen that those LEDs have a high efficiency of light takeout.

The process of the invention can be used for producing light-emitting semiconductor devices for use in light-emitting diodes including bullet-shaped LEDs.

While the present invention has been described in detail and with reference to specific embodiments thereof, it will be apparent to one skilled in the art that various changes and modifications can be made therein without departing from the spirit and scope thereof.

This application is based on Japanese patent application No. 2003-423131 filed Dec. 19, 2003, the contents thereof being herein incorporated by reference.

What is claimed is:

1. A process for producing a light-emitting semiconductor device, which comprises:
   (1) forming a polycarbodiimide-containing layer on a light takeout side of a light-emitting semiconductor element; and
   (2) forming irregularities on the surface of the polycarbodiimide-containing layer,
   wherein the polycarbodiimide-containing layer contains a polycarbodiimide represented by general formula (1):

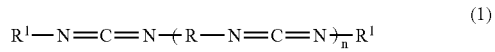

(1)

wherein R represents a diisocyanate residue, $R^1$ represents a monoisocyanate residue, and n is an integer of 1 to 100.

2. The process for producing a light-emitting semiconductor device of claim 1, wherein the polycarbodiimide-containing layer before the formation of surface irregularities has a thickness of 0.5 to 10 μm.

3. The process for producing a light-emitting semiconductor of claim 1, wherein the polycarbodiimide-containing layer has a refractive index of 1.7 or higher.

4. The process for producing a light-emitting semiconductor of claim 1, wherein the polycarbodiimide-containing layer has a modulus of elasticity at 150° C. of 0.2 to 3 GPa.

5. The process for producing a light-emitting semiconductor of claim 1, wherein the formation of the irregularities is carried out by pressing the polycarbodiimide-containing layer with a die having irregularities under application of heat.

6. The process for producing a light-emitting semiconductor of claim 1, wherein the irregularities comprise protrusions having a height of 1 to 5 pm.

7. The process for producing a light-emitting semiconductor of claim 6, wherein the protrusions each have a semispherical shape.

* * * * *